United States Patent [19]
Ahmed

[11] B 3,990,017
[45] Nov. 2, 1976

[54] CURRENT AMPLIFIER
[75] Inventor: Adel Abdel Aziz Ahmed, Annandale, N.J.
[73] Assignee: RCA Corporation, New York, N.Y.
[22] Filed: Dec. 11, 1974
[21] Appl. No.: 531,686
[44] Published under the second Trial Voluntary Protest Program on March 23, 1976 as document No. B 531,686.

[52] U.S. Cl. .................................. 330/17; 330/18; 330/22
[51] Int. Cl.² ......................................... H03F 3/18
[58] Field of Search .............. 330/22, 38 M, 40, 17, 330/18; 307/296, 297; 323/22 T

[56] References Cited
UNITED STATES PATENTS
3,551,832  12/1970  Graeme .................................. 330/17

Primary Examiner—James B. Mullins
Attorney, Agent, or Firm—H. Christoffersen; S. Cohen; A. L. R. Limberg

[57] ABSTRACT

Input current is applied to the emitter electrode of a first transistor, of a first conductivity type, to cause a base current response. This base current response is applied to the base electrode of a second transistor, of a second conductivity type complementary to the first conductivity type, to cause a collector current response. This collector current response is applied to the emitter electrode of a third transistor of the second conductivity type to cause another base current response. This latter base current response is applied to the base electrode of a fourth transistor, of the first conductivity type. The fourth transistor responds with an emitter current flow of opposite sense to the input current, but directly proportional thereto without substantial alpha-dependent or beta-dependent errors.

5 Claims, 4 Drawing Figures

CURRENT AMPLIFIER

The present invention is directed to transistor current amplifiers without substantial beta-dependent error.

The current gain of a conventional common-emitter amplifier configuration exhibits beta-dependent error; that is, its current gain is directly proportional to the common-emitter forward current gain, or beta, of its transistor. The current gain of a conventional common-base amplifier configuration exhibits alpha-dependent error; that is, its current gain is directly proportional to the common-base forward current gain, or alpha, of its transistor. Actually, alpha-dependent error is a form of attenuated beta-dependent error since the following well-known relationship obtains between the alpha and beta of a transistor.

$$\alpha = \frac{\beta}{\beta+1}$$

Beta changes markedly as a function of temperature and transistor processing, and it is often desirable or necessary to eschew amplifier configurations with pronounced beta-dependent error.

A class of current amplifiers known as current mirror amplifiers exists. In a current mirror amplifier, the amplitudes of its input and output currents are related in the same ratio as the transconductances of first and second transistors included therewithin. These first and second transistors have their respective collector electrodes connected to the input terminal and to the output terminal, respectively, of the current mirror amplifier. The first transistor is connected as a shunt voltage regulator by means of direct-coupled collector-to-base feedback which applies a potential to its base electrode as referred to its emitter potential which conditions its collector-to-emitter path for the flow of substantially all the input current therethrough. The second transistor is connected to have substantially the same emitter-to-base potential applied to it as the first transistor does. Commonly the ratio of the transconductances of the first and second transistors is accurately and reproducibly determined by manufacturing them with identical diffusion or implantation profiles and scaling the effective areas of their respective base-emitter junctions.

These current mirror amplifiers are, as compared to a common-emitter amplifier, relatively free of beta-dependent error. They tend to exhibit alpha-dependent error or some similar error, however. This is because, while it is easy to apportion the transistor collector currents as desired between input current and output current by matching transconductances, it is difficult to, at the same time, apportion the transistor base currents as desired between input current and output current.

The present invention is directed to a current amplifier using matched current gain characteristic transistors to obtain predictable current gains, rather than using matched transconductance characteristics. Ion implantation techniques have now advanced to the point where the betas of transistors of similar conductivity type can be matched within 1% of each other.

The present invention is embodied in a current amplifier using four transistors, two of each conductivity type, operated as follows: Input current is applied to the emitter electrode of a first transistor, of a first conductivity type, to cause a base current response. This base current response is applied to the base electrode of a second transistor, of a second conductivity type complementary to the first conductivity type, to cause a collector current response. This collector current response is applied to the emitter electrode of a third transistor of the second conductivity type to cause another base current response. This latter base current response is applied to the base electrode of a fourth transistor, of the first conductivity type. The fourth transistor responds with an emitter current flow of opposite sense to the input current, but directly proportional thereto without any alpha-dependent or beta-dependent errors.

Figure 1:
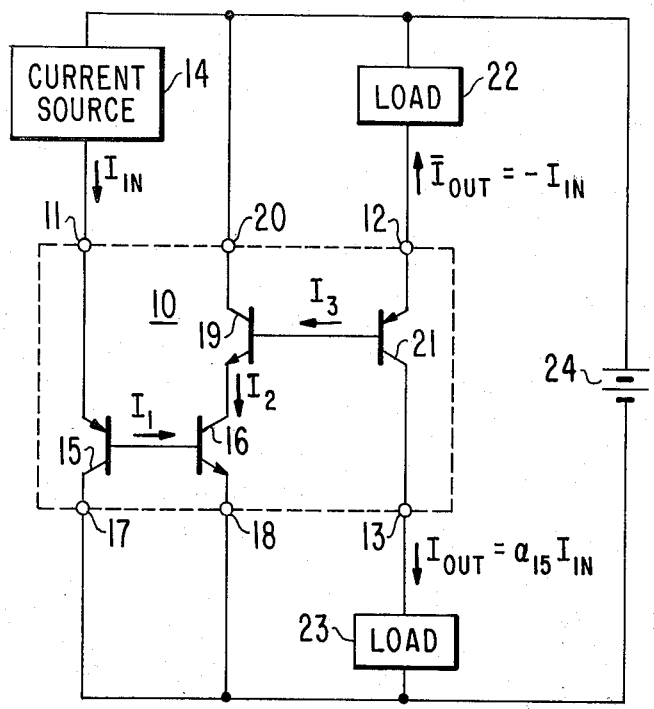
FIG. 1 is a schematic diagram of a current amplifier embodying the present invention and providing output current substantially equal in amplitude to applied input current.

In FIG. 1, current amplifier 10, comprising the elements within dashed outline, has an input signal terminal 11, an inverted output signal terminal 12, and a non-inverted output signal terminal 13. An input current $I_{IN}$ is applied from current source 14 via terminal 11 to the emitter electrode of a PNP transistor 15. Transistor 15 has a common-emitter forward current gain of $\beta_{15}$. Transistor 15 responds to the $I_{IN}$ emitter current supplied to it to supply from its base electrode a current $I_1 = I_{IN}/\beta_{15}$, which is applied to the base electrode of an NPN transistor 16.

In FIG. 1, terminals 17 and 18 at the collector electrode of transistor 15 and the emitter electrode of transistor 16, respectively, are operated at the same potential. The current $I_1$ applied to the base electrode of transistor 16 develops a potential drop across the base-emitter junction of transistor 16. This potential drop reverse biases the collector-base junction of transistor 15 and conditions it for normal transistor operation. Alternatively, additional elements for reverse-biasing the collector-base junction of transistor 15 may be connected between terminals 17 and 18.

Transistor 16 has a common-emitter forward current gain of $\beta_{16}$. Transistor 16 responds to the current $I_1$ applied to its base electrode to demand a collector current $I_2 = \beta_{16} I_1 = \beta_{16} I_{IN}/\beta_{15}$ from the emitter electrode of NPN transistor 19. Terminal 20 to which the collector electrode of transistor 19 is connected to reverse-bias the collector-base junction of transistor 19. Transistor 20 is thereby conditioned for normal transistor operation and has a common-emitter forward current gain of $\beta_{19}$. Transistor 19 responds to the current $I_2$ demanded from its emitter electrode to demand in turn at its base electrode a current $I_3 = I_2/(\beta_{19} + 1)$ $= \beta_{16} I_{IN}/\beta_{15} (\beta_{19} + 1)$. This current demand is from the base electrode of a PNP transistor 21, having its emitter electrode connected to terminal 12 and its collector electrode connected to terminal 13.

Transistor 21 has a common-emitter forward current gain of $\beta_{21}$. Transistor 21 responds to the current $I_3$ demanded from its base electrode to demand a current $I_{OUT} = 1 (\beta_{21} + 1) I_3 = -\beta_{16} (\beta_{21} + 1) I_{IN}/\beta_{15} (\beta_{19} + 1)$ at its emitter electrode and to supply a current $I_{OUT} = \beta_{16} \beta_{21} I_{IN}/\beta_{15} (\beta_{19} + 1)$ from its collector electrode. Now, when ion-implanted transistors are used, the common-emitter forward current gains $\beta_{15}$ and $\beta_{21}$ of PNP transistors 15 and 21, respectively, are each substantially equal to the same value, $\beta_{PNP}$. Also, the common-emitter forward current gains $\beta_{16}$ and $\beta_{19}$ of NPN transistors 16 and 19, respectively, are each substantially equal to the same value $\beta_{NPN}$. Under these or similar circumstances, $\bar{I}_{OUT} = -I_{IN}$, without any alpha-dependent error. Also, $I_{OUT} = I_{IN}\beta_{NPN}/(\beta_{NPN} + 1)$. That is, $I_{OUT} = I_{IN}$, with the same alpha-dependent error as a common-base amplifier transistor.

When current amplifier 10 is used to obtain an inverted output signal at terminal 12 responsive to input signal at terminal 11, a load 22 with a direct-current conductive path therethrough will be connected between terminal 12 and the positive terminal of a supply 24 of operating potential. Terminal 13 will be connected to the negative terminal of supply 24 either by a load 23 with a direct-current-conductive path therethrough, as shown, or by other direct-current conductive means (e.g., a direct connection or a resistor). Current amplifier 10 operated in this mode has no alpha-dependent error and therefore is advantageous over current mirror amplifiers using transconductance scaling to determine current gain.

When current amplifier 10 is used to obtain a non-inverted output signal at terminal 13 responsive to input signal at terminal 11, a load 23 with a direct-current-conductive path therethrough will be connected between terminal 13 and the negative terminal of a supply 24 of operating potential. Terminal 12 will be connected to the positive terminal of supply 21 either by a load with a direct-current-conductive path therethrough, as shown or by other direct-current-conductive means (e.g., a direct connection or a resistor). Current amplifier 10 will exhibit the same alpha-dependent error its current gain for this connection as a common-base amplifier transistor does and will generally resemble a simple PNP transistor in common-base amplifier configuration.

However, in a common-base transistor amplifier, the input and output circuits are in serial connection between the negative and positive terminals of the supply of operating potential, so the sum of the input and output signal potentials must never exceed that operating potential. In current amplifier 10, on the other hand, the input and output circuits are in parallel connection between the negative and positive terminals of the supply 24 of operating potential. So, both the input signal potential and the output signal potential can each approach full supply potential. This capability is desirable, since supply potentials are kept small in integrated circuits to keep their power dissipations within reasonable bounds. Also, a current mirror amplifier can be operated with its input terminal 11 at a less positive or more negative potential than its output terminal 13. A PNP transistor in common-base amplifier configuration, on the other hand, cannot be operated with its emitter electrode (i.e., its input terminal) less positive or more negative than its collector electrode (i.e., its ouput terminal). The greater flexibility in operation available with current amplifier 10 permits it to be used in many direct-coupled amplifier applications where input and output biasing conditions, which are respectively determined by preceding and succeeding circuitry, respectively, would preclude use of a common-base transistor amplifier. This is particularly important in integrated circuitry where extensive use of direct-coupling is necessary because of the difficulty of integrating capacitors of relatively large value.

Current source 14 may supply a current $I_{IN}$ comprising a signal current superimposed on a direct current component to terminal 11. Current mirror amplifier 10 will behave as a phase-splitter providing oppositely swinging signal currents at its terminals 12 and 13. If loads 22 and 23 present substantially equal impedances, oppositely swinging signal potentials of similar amplitude will appear at terminals 12 and 13, respectively.

Figure 2:
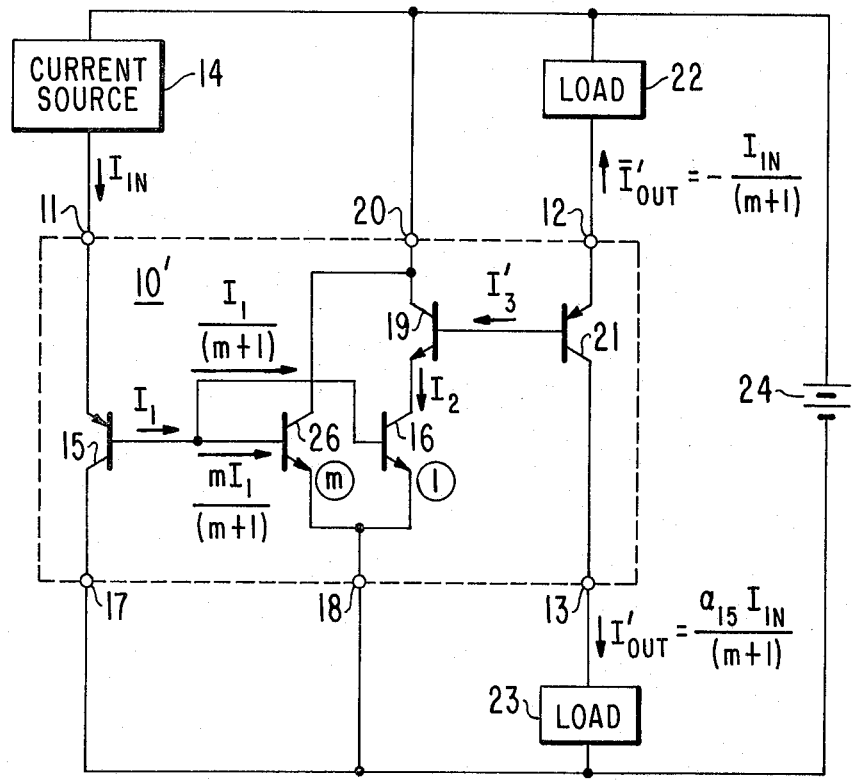
FIG. 2 is a schematic diagram of a current amplifier embodying the present invention and providing output current with amplitude related to input current amplitude in 1:($m$+1) ratio.

FIG. 2 shows a current amplifier 10' having current gains of less than unity. Current amplifier 10' differs from current amplifier 10 in that an NPN transistor 26 is connected so its base-emitter junction parallels that of transistor 16. Transistors 16 and 26 have the same emitter-base profiles insofar as the cross section of the integrated circuit is concerned, but the effective area of the base-emitter junction of transistor 26 is made $m$ times as large as that of transistor 16. In FIG. 2, this structural feature is indicated by the circled numbers near the base-emitter junctions of transistors 16 and 26. This construction causes the resistance looking into the base electrode of transistor 26 to be $1/m$ times the resistance looking into the base electrode of transistor 16. So, the current $I_1$ flowing from the base of transistor 15 is divided. Only a current $I_1/(m+1)$ flows to the base electrode of transistor 16, rather than the full $I_1$ current. Therefore, $I_2$, $I_3$, $I_{OUT}$ and $\bar{I}_{OUT}$ are reduced in like proportion.

The accuracy of splitting the current $I_1$ between the base-emitter junctions of transistors 16 and 26 can be further guaranteed by including properly proportioned emitter degeneration resistances in the connections of the emitter electrodes of transistors 16 and 26 to terminal 18, rather than making those connections directly, as shown. The emitter degeneration resistance for transistor 16 should be $m$ times as large as that of transistor 26. The larger those resistances, the less the need for accurately proportioning the base-emitter junction resistance characteristic of transistors 16 and 26.

Alternatively, if only non-inverted output current $I_{OUT}$ is to be used, the current gain of the current amplifier 10 can be analogously diminished by supplying a portion of the $I_3$ current demand from the base electrode of an additional transistor having its base-emitter circuitry parallelled with that of transistor 21. The collector electrode of the additional transistor is connected so as to bias the additional transistor for normal transistor operation and so that its collector current does not pass through the load 23.

Figure 3:
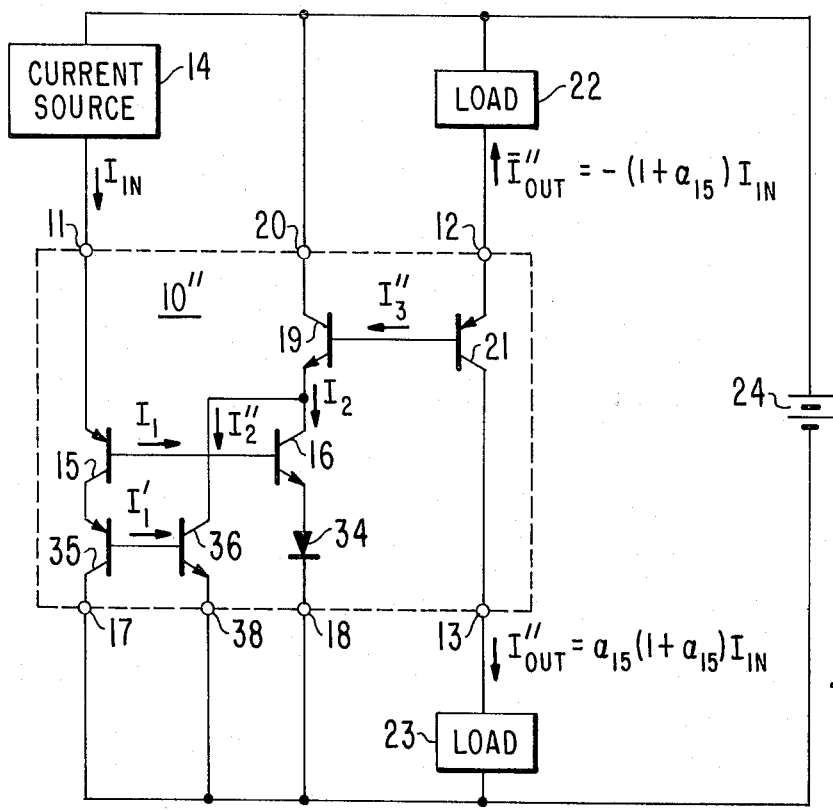
FIGS. 3 and 4 are schematic diagrams of current amplifiers, each embodying the present invention and providing output current with amplitude related to input current amplitude in 2:1 ratio.

In FIG. 3, a current amplifier 10'' is a variant of current amplifier 10, but has a current gain the amplitude of which is substantially two, is shown. The common-emitter forward current gains of transistors 35 and 36 match those of transistors 15 and 16, respectively. The emitter electrode of transistor 16 in current amplifier 10'' is connected to terminal 18 by a diode 34, which responds to the emitter current of transistor 16 to provide an offset potential across itself. This offset potential, which may be provided by other known means, biases the base electrode of transistor 15 sufficiently positive with respect to the negative terminal of supply 21 that the collector current of transistor 15 may be applied to the emitter electrode of transistor 35 in an analogous manner as $I_{IN}$ is applied to the emitter electrode of transistor 15. The connection of transistors 35 and 36 is otherwise exactly as the connection of transistors 15 and 16 in current amplifier 10.

Now, the collector current of transistor 15 is its common-base forward current gain $\alpha_{15}$ times as large as its emitter current, $I_{IN}$. Therefore, the emitter current of transistor 35 is $\alpha_{15} I_{IN}$. Its base current $I_1'$ is $\alpha_{15} I_1$; so is the base current of transistor 36. The collector current $I_2''$ of transistor 36 will be $\alpha_{15} I_2$. The emitter current of transistor 19 will be $I_2 + I_2'' = (1 + \alpha_{15})I_2$, so its base current $I_3''$ will be $(1 + \alpha_{15})I_3$. The base current of transistor 21 will be $(1 + \alpha_{15})$ times as large in current amplifier $10''$ as in current amplifier 10, so its output currents $\bar{I}_{OUT}''$ and $I_{OUT}''$ will each be $(1 + \alpha_{15})$ times as large as $\bar{I}_{OUT}$ and $I_{OUT}$ of current amplifier 10. Since $\alpha_{15}$ approaches unity, the current gain between terminals 11 and 12 is substantially $-2$, and the current gain between terminals 11 and 13 is substantially 2.

The iterative sensing of the $I_{IN}$ current, as done twice by transistors 15 and 35 in current amplifier $10''$, may also be done $n$ times where $n$ is an integer three or more to get current gains with amplitudes substantially equal to $n$, using circuits based on the same principles as the FIG. 3 circuit.

Figure 4:
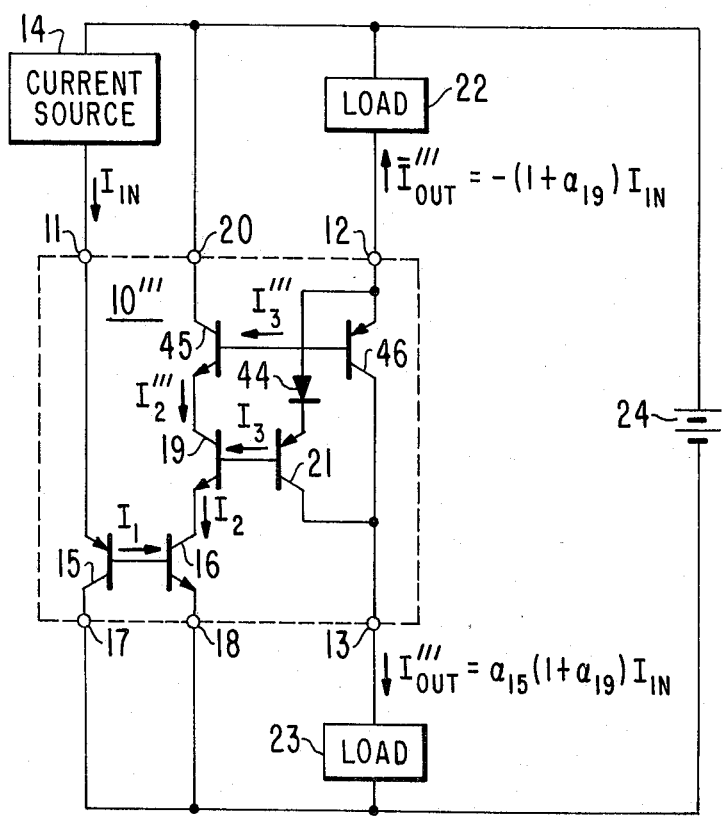

FIG. 4 shows a current amplifier $10'''$ which is another variant of the current amplifier 10 and has current-gain amplitudes of substantially two. The common-emitter forward current gains of transistors 45 and 46 match those of transistors 19 and 21, respectively. In it, iterative sensing of the $I_2$ current is used. The current $I_2$ withdrawn from the emitter electrode of transistor 19 causes a collector current $I_2'''$ to be demanded by transistor 19 from the emitter electrode of transistor 45. $I_2'''$ equals $\alpha_{19} I_2$, where $\alpha_{19}$ is the common-base forward current gain of transistor 19. $I_3'''$ is $\alpha_{19}$ times as large as $I_3$, since transistors 19 and 45 have similar current gains. Since transistors 21 and 46 have similar current gains, the emitter and collector currents of transistor 46 are $\alpha_{19}$ times as large as the collector current $I_{OUT}$ and the emitter current $\bar{I}_{OUT}$ of transistor 21, respectively. The current $\bar{I}_{OUT}'''$ presumed to flow out of terminal 12 of current amplifier $10'''$ is the sum of the emitter currents of transistors 21 and 46 and equals $-(1 + \alpha_{19})I_{OUT}$, which is to say $=(1 + \alpha_{19}) I_{IN}$. Since $\alpha_{19}$ is substantially unity, this is a gain of substantially $-2$. $I_{OUT}'''$ presumed to flow out of terminal 13 of current mirror amplifier $10''''$ is the sum of the collector currents of transistors 21 and 46 and equals $\alpha_{15}(1 + \alpha_{19})I_{IN}$. Since $\alpha_{15}$ and $\alpha_{19}$ are each substantially unity, this is a gain of substantially two.

Diode 44 responds to the emitter current of transistor 21 to develop the offset potential required to permit successive sensing of current $I_2$ by transistors 19 and 45. Iterative sampling of $I_2$ $n$ times may be used to obtain a current amplifier with current gains having amplitudes substantially equal to $n$, using circuits based on the same principles as the FIG. 4 circuit.

I claim:

1. A current amplifier comprising:
   first and second and third and fourth transistors, each having base and emitter and collector electrodes, said first and said fourth transistors being of a first conductivity type and having matched common-emitter forward current gain characteristics, said second and said third transistors being of a second conductivity type and having matched common-emitter forward-current gain characteristics, said first and said second conductivity types being complementary to each other, said first transistor base electrode being connected to said second transistor base electrode, said third transistor base electrode being connected to said fourth transistor base electrode;
   supply means, with first and second terminals, for supplying an operating potential between its said first and said second terminals;
   first direct current conductive means connected between said first transistor collector electrode and said first terminal of said supply means;
   second direct current conductive means connected between said second transistor emitter electrode and said first terminal of said supply means;
   third direct current conductive means connected between said second transistor collector electrode and said third transistor emitter electrode;
   fourth direct current conductive means connected between said third transistor collector electrode and said second terminal of said supply means;
   means exclusive of said fourth transistor connected to said first transistor emitter electrode for causing an input current flow therethrough;
   a first path for direct current, connecting said fourth transistor collector electrode and said first terminal of said supply means;
   a second path for direct current, connecting said fourth transistor emitter electrode and said second terminal of said supply means; and
   first load means for receiving an output current responsive to said input current, said first load means being included in one of said first and said second paths for direct current.

2. A current amplifier as set forth in claim 1 having a second load means, said first and said second load means being included respectively in said first and said second paths for direct current.

3. A current amplifier as set forth in claim 1 having:
   a fifth transistor of said second conductivity type, said fifth transistor having base and emitter and collector electrodes;
   fifth direct current conductive means connected between said first transistor base electrode and said fifth transistor base electrode;
   sixth direct current conductive means connected between said fifth transistor emitter electrode and said first terminal of said supply means; and
   seventh direct current conductive means connected between said fifth transistor collector electrode and said second terminal of said supply means.

4. A current amplifier as set forth in claim 1 having:
   fifth and sixth transistors respectively of said first conductivity type and of said second conductivity type, each having base and emitter and collector electrodes, said fifth transistor having a common-emitter forward current gain characteristic matched to those of said first and said fourth transistors, said sixth transistor having a common-emitter forward current gain characteristic matched to those of said second and said third transistors, said fifth transistor having its emitter electrode connected to the collector electrode of said first transistor and having its collector electrode connected to said first terminal of said supply means and comprising said first direct current conductive means;

fifth direct current conductive means connected between said fifth transistor base electrode and said sixth transistor base electrode;

sixth direct current conductive means connected between said sixth transistor emitter electrode and said first terminal of said supply means;

seventh direct current conductive means connected between said sixth transistor collector electrode and said third transistor emitter electrode; and means for providing an offset potential, said means being included in said second direct current conductive means, said offset potential being of sufficient magnitude that said first transistor has its collector electrode biased relative to its base electrode so as to permit normal transistor operation thereof.

5. A current amplifier as set forth in claim 1 having:

fifth and sixth transistors respectively of said second conductivity type and of said first conductivity type, each having base and emitter and collector electrodes, said fifth transistor having a common-emitter forward current gain characteristic matched to those of said second and said third transistors, said sixth transistor having a common-emitter forward current gain characteristic matched to those of said first and said fourth transistors, said fifth transistor having its emitter electrode connected to the collector electrode of said second transistor and having its collector electrode connected to said second terminal of said supply means and comprising said third direct current conductive means, said sixth transistor collector electrode being connected to said first terminal of said supply means via said second path for direct current;

sixth direct current conductive means connected between the base electrodes of said fifth and said sixth transistors; and means connected between the emitter electrodes of said fourth and said sixth transistors for conducting the emitter current of said sixth transistor and maintaining an offset potential between their emitter electrodes, said offset potential being of sufficient magnitude that said third transistor has its collector electrode biased relative to its base electrode so as to permit normal transistor operation.

* * * * *